United States Patent
Tsui et al.

(10) Patent No.: US 6,740,951 B2
(45) Date of Patent: May 25, 2004

(54) TWO-MASK TRENCH SCHOTTKY DIODE

(75) Inventors: Yan Man Tsui, Union City, CA (US); Fwu-Iuan Hshieh, Saratoga, CA (US); Koon Chong So, Fremont, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/862,532

(22) Filed: May 22, 2001

(65) Prior Publication Data

US 2002/0175342 A1 Nov. 28, 2002

(51) Int. Cl.$^7$ ............... H01L 27/095; H01L 29/47; H01L 29/812; H01L 31/07; H01L 21/28
(52) U.S. Cl. ............... 257/483; 257/484; 438/570; 438/576
(58) Field of Search ............... 257/483–484, 257/109, 493, 497; 438/570–583

(56) References Cited

U.S. PATENT DOCUMENTS

| | | | |
|---|---|---|---|
| 4,646,115 A | * 2/1987 | Shannon et al. | 257/484 |
| 4,862,229 A | * 8/1989 | Mundy et al. | 257/484 |
| 5,365,102 A | 11/1994 | Mehrotra et al. | 257/475 |
| 5,612,567 A | 3/1997 | Baliga | 257/475 |
| 6,078,090 A | 6/2000 | Williams et al. | 257/476 |
| 6,309,929 B1 | * 10/2001 | Hsu et al. | 438/270 |
| 2001/0010385 A1 | * 8/2001 | Hijzen et al. | 257/471 |

* cited by examiner

*Primary Examiner*—Shouxiang Hu
(74) *Attorney, Agent, or Firm*—Mayer Fortkort & Williams, PC; Stuart H. Mayer, Esq.; Karin L. Williams, Esq.

(57) ABSTRACT

A Schottky rectifier includes a semiconductor structure having first and second opposing faces each extending to define an active semiconductor region and a termination semiconductor region. The semiconductor structure includes a cathode region of the first conductivity type adjacent the first face and a drift region of the first conductivity type adjacent the second face. The drift region has a lower net doping concentration than that of the cathode region. A plurality of trenches extends from the second face into the semiconductor structure and defines a plurality of mesas within the semiconductor structure. At least one of the trenches is located in each of the active and the termination semiconductor regions. A first insulating region is located adjacent the semiconductor structure in the plurality of trenches. A second insulating region electrically isolates the active semiconductor region from the termination semiconductor region. An anode electrode is (a) adjacent to and forms a Schottky rectifying contact with the semiconductor structure at the second face and is (b) adjacent to the first insulating region in the trenches. The anode electrode electrically connects together the plurality of trenches.

26 Claims, 4 Drawing Sheets

TWO-MASK TRENCH SCHOTTKY DIODE

FIELD OF THE INVENTION

The present invention relates generally to rectifiers and more particularly to Schottky barrier rectifying devices, and methods of forming these devices.

BACKGROUND OF THE INVENTION

Power devices typically include an active region and a termination region at the periphery of the active region to prevent premature voltage breakdown. Conventional termination structures include local oxidation of silicon (LOCOS), field plate, guard ring, or a combination thereof. Because large electric fields can arise in the vicinity of the LOCOS, a significant leakage current may flow through leakage paths in the termination region. A conventional approach to reducing such leakage currents is shown in FIG. 1.

FIG. 1 shows a substrate 12 on which a trench Schottky rectifier is formed. The device includes an active region 5 and a termination region 10. The semiconductor substrate 12 has a first conductivity type, typically N-type conductivity, on which an epitaxial layer 20 is formed. Epitaxial layer 20 is also of the first conductivity type and more lightly doped than substrate 12. A series of trenches 30 are formed in the active region 5 of the device. The trenches are lined with a gate oxide layer 25 and filled with doped polysilicon. The polysilicon filled trenches 30 are continuously connected over the surface of the structure. A LOCOS region 40 is formed in the termination region 10 to isolate the active region 5 from the termination region 10. The LOCOS region 40 extends to the boundary defining the active region 5 and the termination region 10.

A p+ doped region 50 is formed below LOCOS region 40 by ion implantation and diffusion. Doped region 50 enhances the reverse-biased voltage so that pinch-off is maintained in the termination region 10, thus eliminating a path through which leakage current can be conducted. A metal anode layer 55 is formed over the exposed surfaces of the polysilicon-filled trenches 30 and epitaxial layer 20 in the active region 5 and over the LOCOS region 40 in the termination region.

Unfortunately, the device shown in FIG. 1 is relatively complex and expensive to manufacture because three lithographic masking steps are involved. Specifically, a separate masking step is required to form the trenches, p+doped region, and contacts.

Accordingly, it would be desirable to provide a structure for a trench Schottky diode in which premature voltage breakdown arising from leakage currents is avoided and which can be manufactured with less than three lithographic masking steps.

SUMMARY OF THE INVENTION

In accordance with the present invention, a Schottky rectifier is provided. The rectifier includes a semiconductor structure having first and second opposing faces each extending to define an active semiconductor region and a termination semiconductor region. The semiconductor structure includes a cathode region of the first conductivity type adjacent the first face and a drift region of the first conductivity type adjacent the second face. The drift region has a lower net doping concentration than that of the cathode region. A plurality of trenches extends from the second face into the semiconductor structure and defines a plurality of mesas within the semiconductor structure. At least one of the trenches is located in each of the active and the termination semiconductor regions. A first insulating region is located adjacent the semiconductor structure in the plurality of trenches. A second insulating region electrically isolates the active semiconductor region from the termination semiconductor region. An anode electrode is (a) adjacent to and forms a Schottky rectifying contact with the semiconductor structure at the second face and is (b) adjacent to the first insulating region in the trenches. The anode electrode electrically connects together the plurality of trenches.

In accordance with one aspect of the present invention, the first insulating region may comprise an oxide or, alternatively, a silicon dioxide.

In accordance with another aspect of the present invention, the trench extends into the cathode region.

In accordance with yet another aspect of the invention, the anode electrode is polysilicon and the second insulating region is a LOCOS region.

DETAILED DESCRIPTION

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art.

Figure 2:
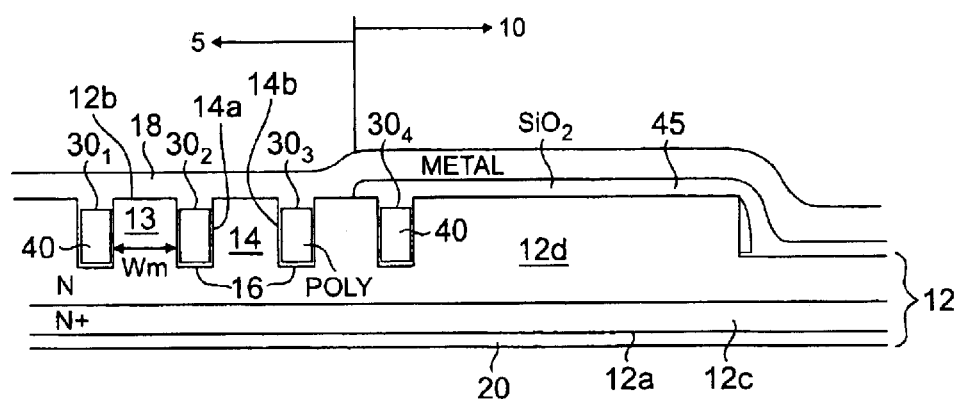
FIG. 2 is a schematic cross-sectional view of a trench Schottky diode constructed in accordance with the principles of the present invention.

Referring now to FIG. 2, a cross-sectional illustration of a Schottky barrier rectifier according to the present invention is shown. The rectifier includes a semiconductor substrate 12 of first conductivity type, typically N-type conductivity, having a first face 12a and second opposing faces 12b. An active region 5 and termination region 10 are defined on the substrate 12. The substrate semiconductor 12 preferably comprises a relatively highly doped cathode region 12c (shown as N+) adjacent first face 12a. As illustrated, the cathode region 12c is doped to a first conductivity type dopant concentration of about $5 \times 10^{19}/cm^3$. A drift region 12d of first conductivity type (shown as N) preferably extends from the cathode region 12c to second faces 12b. As illustrated, the drift region 12d is doped to a first conductivity type dopant concentration of about $3.3 \times 10^{16}/cm^3$ for a 30 Volt device. Drift region 12d and cathode region 12c form a non-rectifying N+/N junction.

Mesas 14 are formed in both the active and termination regions 5 and 10 of the device. Mesas 14 having cross-sectional width "$W_m$" are formed in the drift region 12d. Mesas are defined by opposing trenches 30. Insulating regions 16 (in this case, shown as thermally grown oxide layers) are formed within the trenches $30_1$–$30_4$ and are adjacent the semiconductor region 12. Insulating regions 16 typically have a total thickness on the order of about 700 to 2000 Angstroms. $W_m$ is typically on the order of 1 micron. Trench depth "d" is typically on the order of 3 microns.

Mesas 14 extend in a third dimension (not shown) and can be of stripe, rectangular, cylindrical or other similar geometry. Hence, as will be understood by those skilled in the art, mesas 14 can be formed in the semiconductor 12 using numerous trench configurations. For example, mesa 14 can be formed between pairs of adjacent linear trenches $30_1-30_4$ that extend in a third dimension. As another example, an annular-shaped trench 30 can form mesa 14. For both of these examples, when viewed in transverse cross section, the trenches $30_1-30_4$ will appear as shown in FIG. 2. Regardless of the trench configuration that is employed, the trenches 30 are all connected to one another.

Trenches $30_1-30_4$ are filled with doped polysilicon. Trenches $30_1-30_4$ are all shorted by polysilicon. A LOGOS region 45 is formed in the termination region 10 to isolate the active region 5 from the termination region 10. The LOGOS region 40 extends to the boundary defining the active region 5 and the termination region 10. A metal anode layer 18 is formed over the exposed surfaces of the polysilicon-tilled trenches $30_1-30_4$ and drift region 12d in the active region 5 of the device, and over the LOGOS region 40 in the termination region of the device. Anode electrode 18 forms a Schottky barrier rectifying junction where it contacts the semiconductor drain region 12d, i.e., along second faces 12b.

As shown in FIG. 2, at least one trench 304 is formed in the termination region 10 of the device. That is, trench $30_4$ is located below LOGOS region 45 and is in contact therewith. In accordance with the present invention, trench $30_4$ is electrically connected to metal anode layer 18 so that it is electrically shorted to the polysilicon in the trenches located in the active region of the device. That is, trench 304 is continuously connected to trench 303 just as trenches $30_1-30_3$ in the active region 5 of the device are continuously connected to one another (see FIG. 1(b)).

Figure 1:
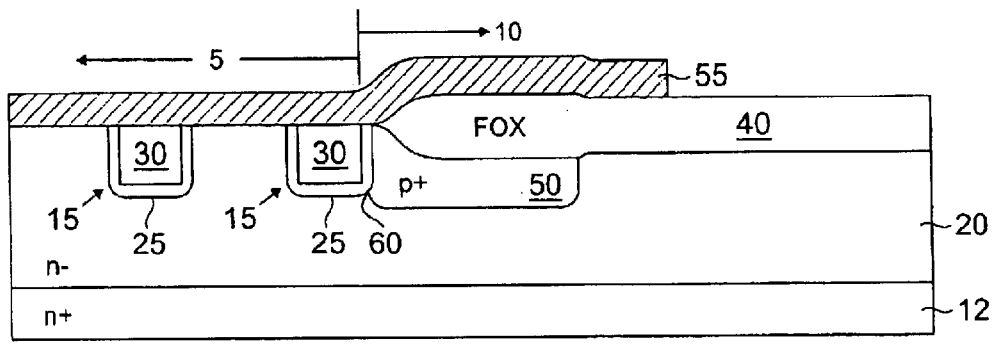
FIG. 1 is a schematic cross-sectional view of a conventional trench Schottky diode illustrating both its active and termination regions.

By providing a trench in the termination region of the device that is shorted to the trenches in the active region of the device, pinch-off is maintained in the termination region without the need for a p-doped region such as p-doped region 50 shown in the device of FIG. 1. Pinch-off is maintained because when a depletion region is formed around the trenches in the active region, a depletion region is also formed around the trench in the termination region. Accordingly, the inventive Schottky rectifier is simpler and less costly to manufacture than the device shown in FIG. 1 because it does not require a masking step to form the p-doped region.

In some embodiments of the invention, it may be advantageous to provide more than one trench in the termination region of the device. The additional trench or trenches will be used as necessary to ensure that the depletion region is spread throughout the termination region of the device. In general, devices operating at high voltages may require a greater number of trenches. In this case each of the trenches in the termination region is shorted to the trenches in the active region of the device. Moreover, the distance between adjacent trenches in the termination region may be different from the distance between adjacent trenches in the active region of the device. In particular, in some cases it may be necessary to reduce the distance between adjacent trenches in the termination region in order to maintain pinch-off.

Finally, a cathode electrode 20 is provided adjacent the cathode region 12c at the first face 12a. The cathode electrode 20 preferably ohmically contacts the cathode region 12c.

Figure 3A:
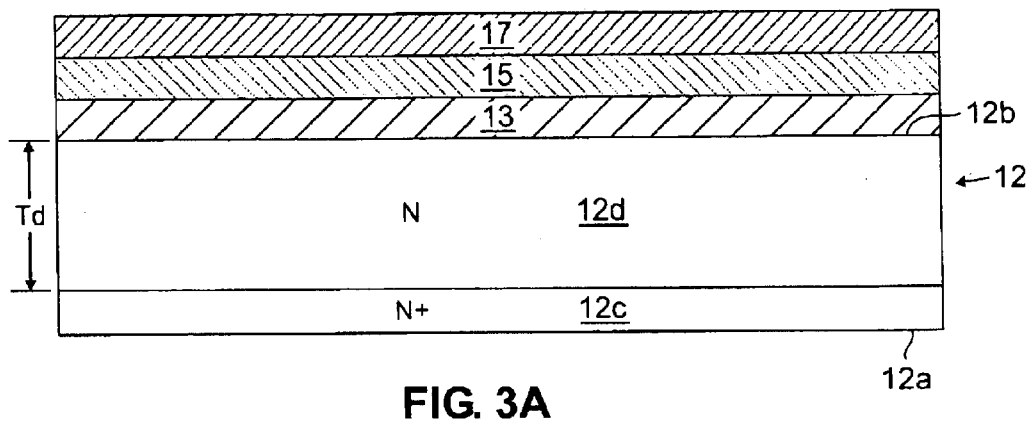
FIGS. 3(a)–3(e) show a series of exemplary process steps that may be used to fabricate the trench Schottky diode depicted in FIG. 2.
Figure 3B:
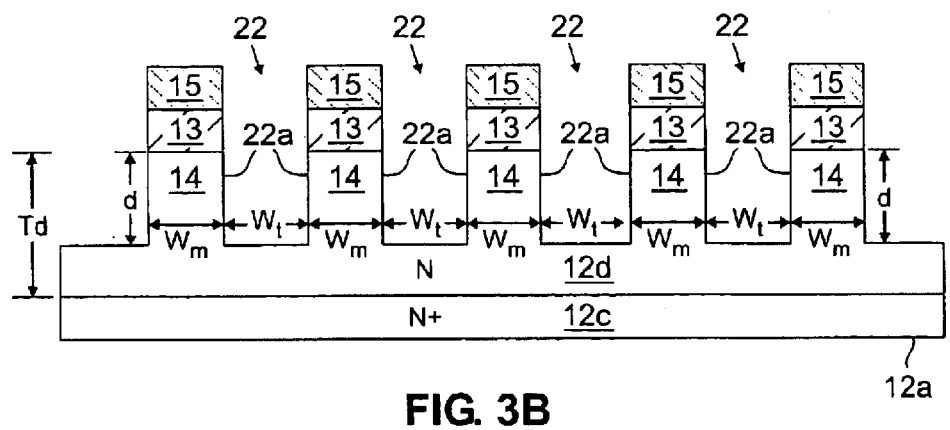

Referring now to FIGS. 3a–3e, a technique for fabricating the rectifier of FIG. 2 will be described. Referring first to FIG. 3a, a substrate 12 having first and second opposing faces 12a and 12b is provided with a relatively highly doped cathode region 12c at face 12a, and a drift region 12d on the cathode region, extending to the second face 12b. As will be understood by one skilled in the art, the drift region 12d having thickness "$T_d$", may be provided by epitaxial growth using conventional techniques. A plurality of adjacent mesas 14 can be formed in the drift region 12d by initially providing a multilayered stack of oxide ($SiO_2$), nitride ($Si_3N_4$) and photoresist (regions 13, 15, and 17, respectively) on the second face 12b. Although the formation of the oxide regions 13 is not necessary, the oxide regions 13 are preferably made relatively thin, approximately 100 angstroms to relieve interlayer stress between the semiconductor 12 and the nitride regions 15. Then, conventional lithographic patterning and etching steps can be performed to form discrete mesas 14 having thermal oxidation resistant nitride regions 15, as shown by FIG. 3b. Regions 15 are also chosen to be removable by an etch that does not etch $SiO_2$.

As will be understood by one skilled in the art, the etching step defines a plurality of first, second, third and fourth adjacent trenches 22, having respective trench widths "$W_t$" and trench depth "d", in the drift region 12d. If mesas 14 of stripe geometry are to be formed, the respective first, second, third and fourth trench sidewalls 22a will extend parallel to each other in a third direction orthogonal to the cross-sectional view (not shown). Alternatively, the patterning and etching steps can be performed to define rectangular, cylindrical or other similar geometries. However, because rectangular or cylindrical mesas occupy a comparatively smaller percentage of total forward conduction area for a given size substrate than mesa stripes of identical width, the forward voltage drop for rectifiers with rectangular or cylindrical mesas will likely be higher for a given forward current.

Figure 3C:
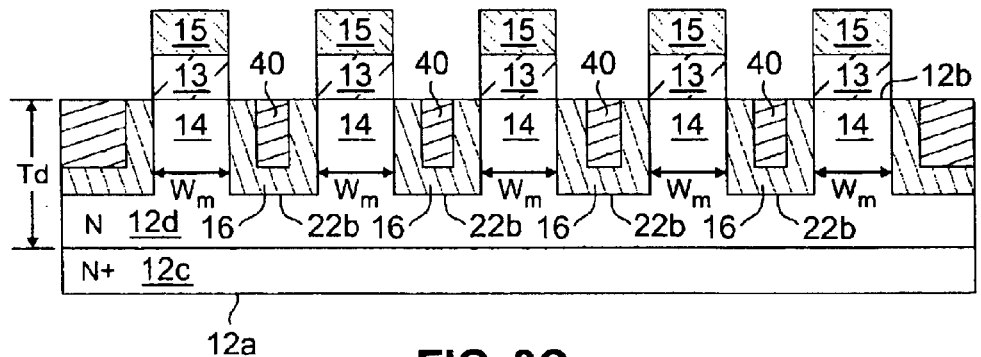

Referring now to FIG. 3c, respective first, second, third and fourth insulating regions 16 such as $SiO_2$ (approx. 1000 angstroms) can be formed on the trench sidewalls 22a and on the trench bottoms 22b, using conventional thermal oxide growth, but not on the face 12b because of the presence of the nitride regions 15. Next, the trenches 22 are filled with polysilicon 40, i.e., polycrystalline silicon. Prior to deposition, the polysilicon is typically doped with phosphorous chloride or implanted with arsenic or phosphorous to reduce its resistivity, typically within the range of 20 Ω/m.

Figure 3D:
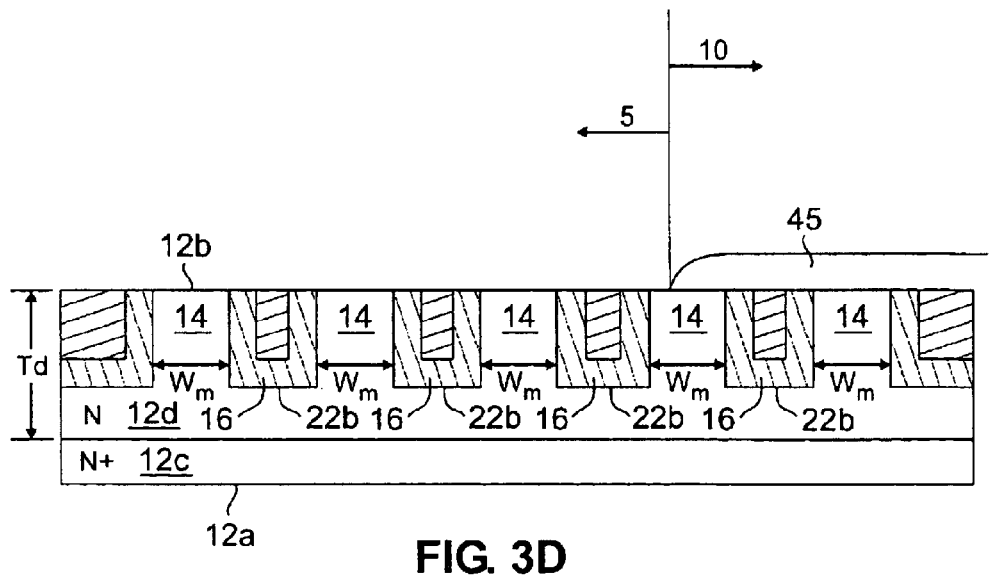
Figure 3E:
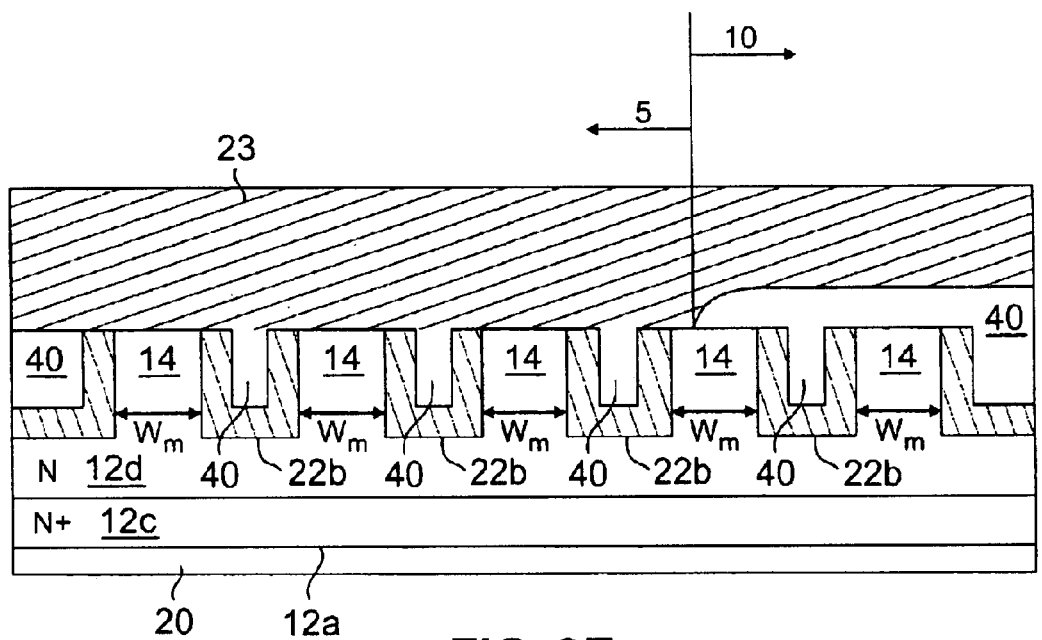

Next, referring to FIG. 3d, the nitride regions 15 and stress relief oxide regions 13 (if present) are removed and, thereafter, a dielectric layer 45 is formed to define the termination region 10 of the device. Dielectric layer 45 is located so that at least one of the trenches 22 is located in the termination region 10. The dielectric layer 45 is typically either a LPTEOS, PETEOS, $O_3$-TEOS or HTO layer and is usually between about 0.2–1.0 microns thick. Top metallization 23 and metal patterning steps are performed to define the anode electrode 18 as shown in FIG. 3e. Finally, a backside metallization step is performed to define the cathode electrode 20 at the first face 12a.

What is claimed is:

1. A Schottky rectifier, comprising:
   a semiconductor structure having first and second opposing faces each extending to define an active semiconductor region and a termination semiconductor region, said semiconductor structure comprising a cathode region of first conductivity type adjacent the first face and a drift region of said first conductivity type adjacent the second face, said drift region having a lower net doping concentration than that of said cathode region;

a plurality of trenches extending from said second face into said semiconductor structure and defining a plurality of mesas within said semiconductor structure, at least one of said trenches being located in each of said active and said termination semiconductor regions;

a first insulating region adjacent said semiconductor structure in said plurality of trenches;

a second insulating region electrically isolating said active semiconductor region to said termination semiconductor region; and an anode electrode that is adjacent to and forms a Schottky rectifying contact with said semiconductor structure at said second face, said anode electrode being adjacent to said first insulating region in said trenches, and electrically connecting together said plurality of trenches.

2. The Schottky rectifier of claim 1 wherein said first insulating region comprises an oxide.

3. The Schottky rectifier of claim 2 wherein said first insulating region comprises silicon dioxide.

4. The Schottky rectifier of claim 1, wherein said semiconductor is silicon.

5. The Schottky rectifier of claim 1, wherein said first conductivity type is n-type conductivity.

6. The Schottky rectifier of claim 1, wherein said trenches extend into said cathode region.

7. The Schottky rectifier of claim 1, wherein said anode electrode is polysilicon.

8. The Schottky rectifier of claim 7, wherein said polysilicon substantially fills said trenches.

9. The Schottky rectifier of claim 1, wherein said second insulating region is a LOCOS region.

10. The Schottky rectifier of claim 1, wherein said semiconductor structure includes a substrate and an epitaxial semiconductor layer grown thereon.

11. A method of forming a Schottky rectifier, comprising:

forming a semiconductor structure having first and second opposing faces each extending to define an active semiconductor region and a termination semiconductor region, said semiconductor structure comprising a cathode region of first conductivity type adjacent the first face and a drift region of said first conductivity type adjacent the second face, said drift region having a lower net doping concentration than that of said cathode region;

forming a plurality of trenches extending from said second face into said semiconductor structure and defining a plurality of mesas within said semiconductor structure, at least one of said trenches being located in each of said active and said termination semiconductor regions;

forming a first insulating region adjacent said semiconductor structure in said plurality of trenches;

forming a second insulating region electrically isolating said active semiconductor region to said termination semiconductor region; and forming an anode electrode that is (a) adjacent to and forms a Schottky rectifying contact with said semiconductor structure at said second face and (b) adjacent to said first insulating region in said trenches, said anode electrode electrically connecting together said plurality of trenches.

12. The method of claim 11, further comprising providing a cathode electrode on said first face of said semiconductor structure.

13. The method of claim 11, wherein said step of forming said semiconductor structure comprises providing a semiconductor substrate, said semiconductor substrate corresponding to said cathode region; and growing an epitaxial semiconductor layer on said substrate, said epitaxial layer corresponding to said drift region.

14. The method of claim 11, wherein said step of forming said trenches comprises the steps of forming a patterned masking layer over the second face of the semiconductor structure etching said trenches through said masking layer.

15. The method of claim 11 wherein said step of forming said anode electrode comprises the step of depositing polysilicon over the first insulating layer.

16. The method of claim 14 wherein said step of forming said anode electrode comprises the step of depositing polysilicon over the first insulating layer.

17. The method of claim 11, wherein said trenches are formed such that they extend into said cathode region.

18. The method of claim 11 wherein said first insulating region comprises an oxide.

19. The method of claim 18 wherein said first insulating region comprises silicon dioxide.

20. The method of claim 11, wherein said semiconductor is silicon.

21. The method of claim 11, wherein said first conductivity type is n-type conductivity.

22. The method of claim 11, wherein said trench extends into said cathode region.

23. The method of claim 11, wherein said anode electrode is polysilicon.

24. The method of claim 23, wherein said polysilicon substantially fills said trenches.

25. The method of claim 11, wherein said second insulating region is a LOCOS region.

26. The method of claim 11, wherein said semiconductor structure includes a substrate and further comprising the step of growing an epitaxial semiconductor layer thereon.

* * * * *

UNITED STATES PATENT AND TRADEMARK OFFICE
CERTIFICATE OF CORRECTION

PATENT NO. : 6,740,951 B2
DATED : May 25, 2004
INVENTOR(S) : Yan Man Tsui et al.

It is certified that error appears in the above-identified patent and that said Letters Patent is hereby corrected as shown below:

Column 1,
Line 46, after "trenches,", change "p+doped" to -- p+ doped --.

Column 3,
Line 5, after "For example,", change "mesa" to -- mesas --.
Line 8, after "form", change "mesa" to -- mesas --.
Line 13, after "A", change "LOGOS" to -- LOCOS -- and after "$30_1$-", change "$30_4$" to -- $30_3$ --.
Lines 14 and 20, after "$30_1$-", change "$30_4$" to -- $30_3$ --.
Line 16, first word, change "LOGOS" to -- LOCOS --
Line 17, after "region", change "40" to -- 45 --.
Line 19, after "polysilicon-", change "tilled" to -- filled --.
Line 21, after "over the", change "LOGOS" to -- LOCOS --.
Line 22, change "40" to -- 45 --.
Lines 25 and 31, after "trench", change "304" to -- $30_4$ --.
Line 27, after "below", change "LOGOS" to -- LOCOS --.
Line 32, after "trench", change "303" to -- $30_3$ --.
Line 34, after "another", delete "(see FIG. 1(*b*))".

Column 5,
Line 13, after "face,", add -- and --.

Column 6,
Line 6, after "that is", delete "(a)".
Line 8, after "second face", delete "and (b)" and add -- , and said anode electrode being --.
Line 9, after "said trenches,", delete "said anode electrode" and add -- and --.
Line 23, after "structure", add -- and --.

UNITED STATES PATENT AND TRADEMARK OFFICE
CERTIFICATE OF CORRECTION

PATENT NO. : 6,740,951 B2
DATED : May 25, 2004
INVENTOR(S) : Yan Man Tsui et al.

It is certified that error appears in the above-identified patent and that said Letters Patent is hereby corrected as shown below:

Column 6 (cont'd),
Line 40, after "said", change "trench extends" to -- trenches extend --.

Signed and Sealed this

Fifth Day of April, 2005

JON W. DUDAS
*Director of the United States Patent and Trademark Office*